US012142664B2

(12) United States Patent
Bih et al.

(10) Patent No.: US 12,142,664 B2
(45) Date of Patent: *Nov. 12, 2024

(54) REDUCING METAL GATE OVERHANG BY FORMING A TOP-WIDE BOTTOM-NARROW DUMMY GATE ELECTRODE

(71) Applicant: Taiwan Semiconductor Manufacturing Co., Ltd., Hsinchu (TW)

(72) Inventors: Shih Wei Bih, Taichung (TW); Han-Wen Liao, Taichung (TW); Xuan-You Yan, Taichung (TW); Yen-Yu Chen, Taichung (TW); Chun-Chih Lin, Taipei (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 157 days.

This patent is subject to a terminal disclaimer.

(21) Appl. No.: 17/323,557

(22) Filed: May 18, 2021

(65) Prior Publication Data

US 2021/0280692 A1 Sep. 9, 2021

Related U.S. Application Data

(60) Continuation of application No. 16/050,094, filed on Jul. 31, 2018, now abandoned, which is a division of (Continued)

(51) Int. Cl.
*H01L 29/66* (2006.01)
*H01L 21/28* (2006.01)
(Continued)

(52) U.S. Cl.
CPC .. *H01L 29/66545* (2013.01); *H01L 21/28114* (2013.01); *H01L 21/32135* (2013.01);
(Continued)

(58) Field of Classification Search
CPC ............. H01L 29/66545; H01L 29/513; H01L 29/517; H01L 29/4966; H01L 21/823437;
(Continued)

(56) References Cited

U.S. PATENT DOCUMENTS 5,204,588 A * 4/1993 Ugajin .................. H01J 21/105
313/309
7,045,867 B2 5/2006 Dang et al.
(Continued)

FOREIGN PATENT DOCUMENTS

JP          S6392062        4/1988
KR          20090081346     7/2009
(Continued)

*Primary Examiner* — Michael M Trinh
(74) *Attorney, Agent, or Firm* — HAYNES AND BOONE, LLP

(57) ABSTRACT

A polysilicon layer is formed over a substrate. The polysilicon layer is etched to form a dummy gate electrode having a top portion with a first lateral dimension and a bottom portion with a second lateral dimension. The first lateral dimension is greater than, or equal to, the second lateral dimension. The dummy gate electrode is replaced with a metal gate electrode.

20 Claims, 9 Drawing Sheets

Related U.S. Application Data application No. 15/420,580, filed on Jan. 31, 2017, now Pat. No. 10,446,662.

(60) Provisional application No. 62/405,301, filed on Oct. 7, 2016.

(51) Int. Cl.

| | | |
|---|---|---|
| *H01L 21/3213* | (2006.01) | |
| *H01L 21/8238* | (2006.01) | |
| *H01L 27/092* | (2006.01) | |
| *H01L 29/423* | (2006.01) | |
| *H01L 29/51* | (2006.01) | |
| *H01L 29/49* | (2006.01) | |

(52) U.S. Cl.
CPC ...... *H01L 21/32137* (2013.01); *H01L 27/092* (2013.01); *H01L 29/42376* (2013.01); *H01L 29/513* (2013.01); *H01L 29/517* (2013.01); H01L 21/823828 (2013.01); H01L 21/823842 (2013.01); H01L 29/4966 (2013.01)

(58) Field of Classification Search
CPC ..... H01L 21/823456; H01L 21/823385; H01L 21/823842; H01L 21/823828; H01L 21/82385; H01L 27/092; H01L 27/0925; H01L 27/0927; H01L 27/0928; H01L 21/28114; H01L 21/32137; H01L 21/32135

See application file for complete search history.

(56) References Cited

U.S. PATENT DOCUMENTS

| | | | |
|---|---|---|---|
| 7,135,386 | B2 | 11/2006 | Kataoka |
| 7,405,130 | B2 * | 7/2008 | Saiki ................... H01L 21/2652 |
| | | | 257/E21.639 |
| 8,030,732 | B2 | 10/2011 | Takahashi |
| 8,039,179 | B2 | 10/2011 | Shieh et al. |
| 8,202,681 | B2 | 6/2012 | Lin et al. |
| 8,383,516 | B2 | 2/2013 | Takahashi et al. |
| 8,440,520 | B2 | 5/2013 | Clark |
| 8,722,476 | B2 | 5/2014 | Kamada |
| 8,728,332 | B2 | 5/2014 | Lin et al. |
| 8,822,243 | B2 | 9/2014 | Yan et al. |
| 10,446,662 | B2 * | 10/2019 | Bih ................... H01L 29/66545 |
| 2004/0104411 | A1 * | 6/2004 | Joubert ............... H01L 29/4958 |
| | | | 257/E29.135 |
| 2005/0104139 | A1 | 5/2005 | Furukawa et al. |
| 2005/0269644 | A1 * | 12/2005 | Brask ................ H01L 21/28114 |
| | | | 257/E21.639 |
| 2006/0091468 | A1 | 5/2006 | Liaw |
| 2006/0115938 | A1 | 6/2006 | Wu et al. |
| 2007/0126067 | A1 | 6/2007 | Hattendorf et al. |
| 2007/0164322 | A1 | 7/2007 | Smith et al. |
| 2010/0052074 | A1 | 3/2010 | Lin et al. |
| 2011/0070702 | A1 | 3/2011 | Chien et al. |
| 2011/0079854 | A1 | 4/2011 | Lin |
| 2011/0241118 | A1 * | 10/2011 | Ng .................... H01L 29/66545 |
| | | | 257/364 |
| 2011/0281208 | A1 | 11/2011 | Lin et al. |
| 2012/0278776 | A1 | 11/2012 | Lei et al. |
| 2013/0052815 | A1 | 4/2013 | Cho et al. |
| 2013/0295769 | A1 | 11/2013 | Lin et al. |
| 2013/0320451 | A1 | 12/2013 | Liu et al. |
| 2014/0193974 | A1 | 7/2014 | Lee et al. |
| 2014/0215421 | A1 | 7/2014 | Chen et al. |
| 2014/0242794 | A1 | 8/2014 | Lin et al. |
| 2014/0264760 | A1 | 9/2014 | Chang et al. |
| 2014/0264899 | A1 | 9/2014 | Chang et al. |
| 2014/0273442 | A1 | 9/2014 | Liu et al. |
| 2014/0273446 | A1 | 9/2014 | Huang et al. |
| 2014/0353734 | A1 | 12/2014 | Xie et al. |
| 2015/0069535 | A1 * | 3/2015 | Chang ................. H01L 29/4966 |
| | | | 257/411 |
| 2016/0099324 | A1 * | 4/2016 | Chang ............... H01L 29/42376 |
| | | | 438/587 |
| 2016/0099337 | A1 * | 4/2016 | Cheng ................ H01L 29/7848 |
| | | | 438/585 |
| 2016/0111531 | A1 | 4/2016 | Dong |
| 2016/0260822 | A1 | 9/2016 | Okamoto et al. |
| 2017/0005005 | A1 | 1/2017 | Chen et al. |

FOREIGN PATENT DOCUMENTS

| | | |
|---|---|---|
| TW | 201301356 A | 1/2013 |
| TW | 201614839 A | 4/2016 |

* cited by examiner

REDUCING METAL GATE OVERHANG BY FORMING A TOP-WIDE BOTTOM-NARROW DUMMY GATE ELECTRODE

CROSS-REFERENCE

This application is a continuation of U.S. patent application Ser. No. 16/050,094, filed Jul. 31, 2018, which is a divisional of U.S. patent application Ser. No. 15/420,580, filed Jan. 31, 2017, now U.S. Pat. No. 10,446,662, issued Oct. 15, 2019, which claims benefit of U.S. Provisional Application No. 62/405,301, filed Oct. 7, 2016, all of which are herein incorporated by reference in their entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

To facilitate the semiconductor device scaling down process, metal gate electrodes may be used instead of conventional polysilicon electrodes. The formation of the metal gate electrodes may involve a gate replacement process, in which a dummy gate electrode is removed to form an opening in its place, and the opening is subsequently filled by metal materials to form the metal gate electrode. However, conventional gate replacement processes may leave an overhang in the opening, which may impede the filling of the opening by the metal material. As such, voids may form in the metal gate, which degrades semiconductor device performance.

Therefore, while existing gate replacement processes have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
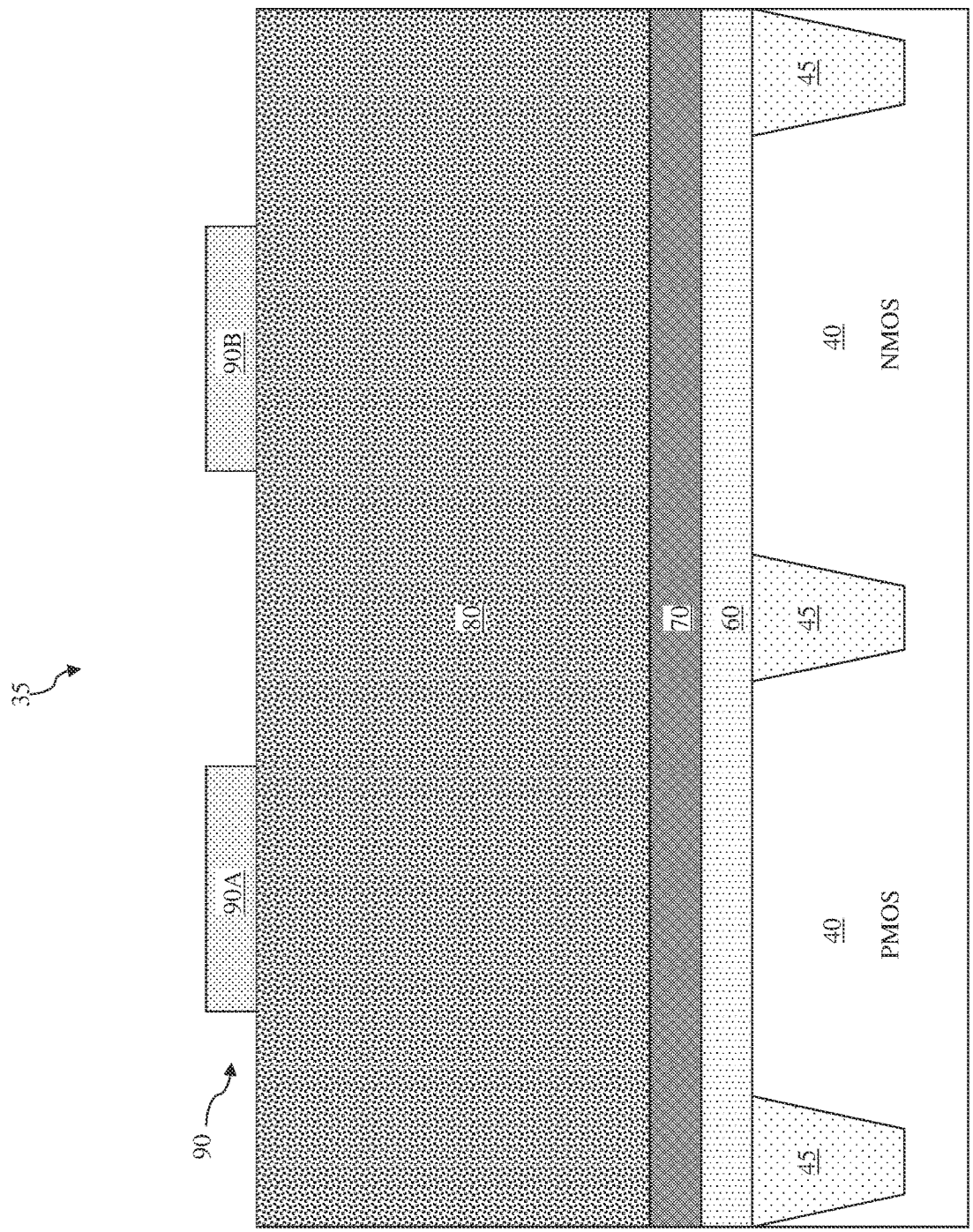
FIG. 1 is a diagrammatic cross-sectional side view of a semiconductor device at a stage of fabrication according to various embodiments of the present disclosure.

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below." "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

As semiconductor fabrication technology advances, metal gate transistors have been used in recent years to enhance the performance of ICs. Metal gate transistors use metal gate electrodes instead of the conventional polysilicon gate electrodes. The fabrication processing of metal gate transistors may involve a gate replacement process, where a polysilicon dummy gate electrode is replaced by a metal gate electrode after the formation of the source/drain regions. However, due to the scaling down of semiconductor devices, critical dimensions (e.g., a width of the gate) have become increasingly small, while an aspect ratio (e.g., a ratio between the height of the gate and the width of the gate) may increase. The small CD and the high aspect ratio of the gate may lead to problems or difficulties in replacing the polysilicon dummy gate electrode with the metal gate electrode. For example, the small CD and the high aspect ratio may lead to an "overhang" situation, where the opening (formed by the removal of the dummy polysilicon gate electrode) is partially blocked. This may result in voids in the metal gate electrode subsequently formed in the opening. The voids in metal gate electrodes degrade the performance of the transistor device (e.g., excessive resistivity), which is undesirable.

To overcome the problems discussed above, the present disclosure uses a novel etching process in the formation of the dummy gate electrodes. The novel etching processes change the profile/shape of the dummy gate electrodes, such that a top portion of the dummy gate electrode is wider than (or at least not narrower than) a bottom portion of the dummy gate electrode. This is in stark contrast to the conventionally-fabricated dummy gate electrodes, where the top portion of the dummy gate electrode is narrower than the bottom portion of the dummy gate electrode. As will become more apparent based on the discussions below, the unique profile of the dummy gate electrodes will cause the opening (formed by their removal) to be more easily filled by metal materials in later processes, which leads to substantially void-free metal gate electrodes. The details of the present disclosure are discussed below with reference to FIGS. 1-8.

FIGS. 1-6 are simplified diagrammatic fragmentary cross-sectional side views of a semiconductor device 35 during various fabrication stages. The semiconductor device 35 may be a part of an integrated circuit (IC) chip, system on chip (SoC), or portion thereof. It may include various passive and active microelectronic devices such as resistors, capacitors, inductors, diodes, metal-oxide semiconductor field effect transistors (MOSFET), complementary metal-oxide semiconductor (CMOS) transistors, laterally diffused MOS (LDMOS) transistors, high power MOS transistors, or other types of transistors. It is understood that FIGS. 1-6 have been simplified for a better understanding of the inventive concepts of the present disclosure. Accordingly, it should be noted that additional processes may be provided before, during, and after the processes shown in FIGS. 1-6 to complete the fabrication of the semiconductor device 35, and that some other processes may only be briefly described herein.

Referring to FIG. 1, a semiconductor device 35 has a substrate 40. The substrate 40 is a silicon substrate doped with a P-type dopant such as boron (for example a P-type substrate). Alternatively, the substrate 40 could be another suitable semiconductor material. For example, the substrate 40 may be a silicon substrate that is doped with an N-type dopant such as phosphorous or arsenic (an N-type substrate). The substrate 40 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, the substrate 40 could include an epitaxial layer (epi layer), may be strained for performance enhancement, and may include a silicon-on-insulator (SOI) structure.

Still referring back to FIG. 1, shallow trench isolation (STI) features 45 are formed in the substrate 40. The STI features 45 are formed by etching recesses (or trenches) in the substrate 45 and filling the recesses with a dielectric material. In the present embodiment, the dielectric material of the STI features 45 includes silicon oxide. In alternative embodiments, the dielectric material of the STI features 45 may include silicon nitride, silicon oxy-nitride, fluoride-doped silicate (FSG), and/or a low-k dielectric material known in the art. In other embodiments, deep trench isolation (DTI) features may be formed in place of, or in combination with, the STI features 45.

An interfacial layer may be optionally formed over the substrate 40. The interfacial layer may be formed by an atomic layer deposition (ALD) process and includes silicon oxide ($SiO_2$).

A gate dielectric layer 60 is formed over the upper surface of substrate 40 (or over the interfacial layer if the interfacial layer is formed). The gate dielectric layer 60 may be formed by an ALD process in some embodiments. In some embodiments, the gate dielectric layer 60 includes a high-k dielectric material. A high-k dielectric material is a material having a dielectric constant that is greater than a dielectric constant of $SiO_2$, which is approximately 4. In an embodiment, the gate dielectric layer 60 includes hafnium oxide ($HfO_2$), which has a dielectric constant that is in a range from approximately 18 to approximately 40. In alternative embodiments, the gate dielectric layer 60 may include one of $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, and SrTiO.

A capping layer 70 is formed over the gate dielectric layer 60. The formation of the capping layer 70 includes one or more deposition and patterning processes. In some embodiments, the capping layer 70 includes a lanthanum oxide material ($LaO_x$, where x is an integer), but it is understood that the capping layer may include other suitable materials (e.g., rare earth oxides such as LaOx, GdOx, DyOx, or ErOx) in other embodiments. In some embodiments, the material of the capping layer may be selected so that it can help tune a work function of a transistor gate (to be formed later), such that a desired threshold voltage may be achieved for the transistor. It is understood that the gate dielectric layer 60 and the capping layer 70 are formed over both an NMOS transistor region and a PMOS transistor region at this stage of fabrication. In some embodiments, a thickness of the capping layer is in a range from about 5 Angstroms to about 20 Angstroms.

A polysilicon layer 80 is formed over the capping layer 70. The polysilicon layer 80 will be patterned later to form dummy gate electrodes. A patterned hard mask layer 90 is formed over the polysilicon layer 80. In some embodiments, the patterned hard mask layer 90 includes multiple layers having different material compositions. For example, the patterned hard mask layer 90 may include a silicon nitride layer formed over the polysilicon layer 80, and it may also include a silicon oxide layer formed over the silicon nitride layer. The patterned hard mask layer 90 may be patterned through a photolithography process into a plurality of segments, such as segments 90A and 90B.

Figure 2:
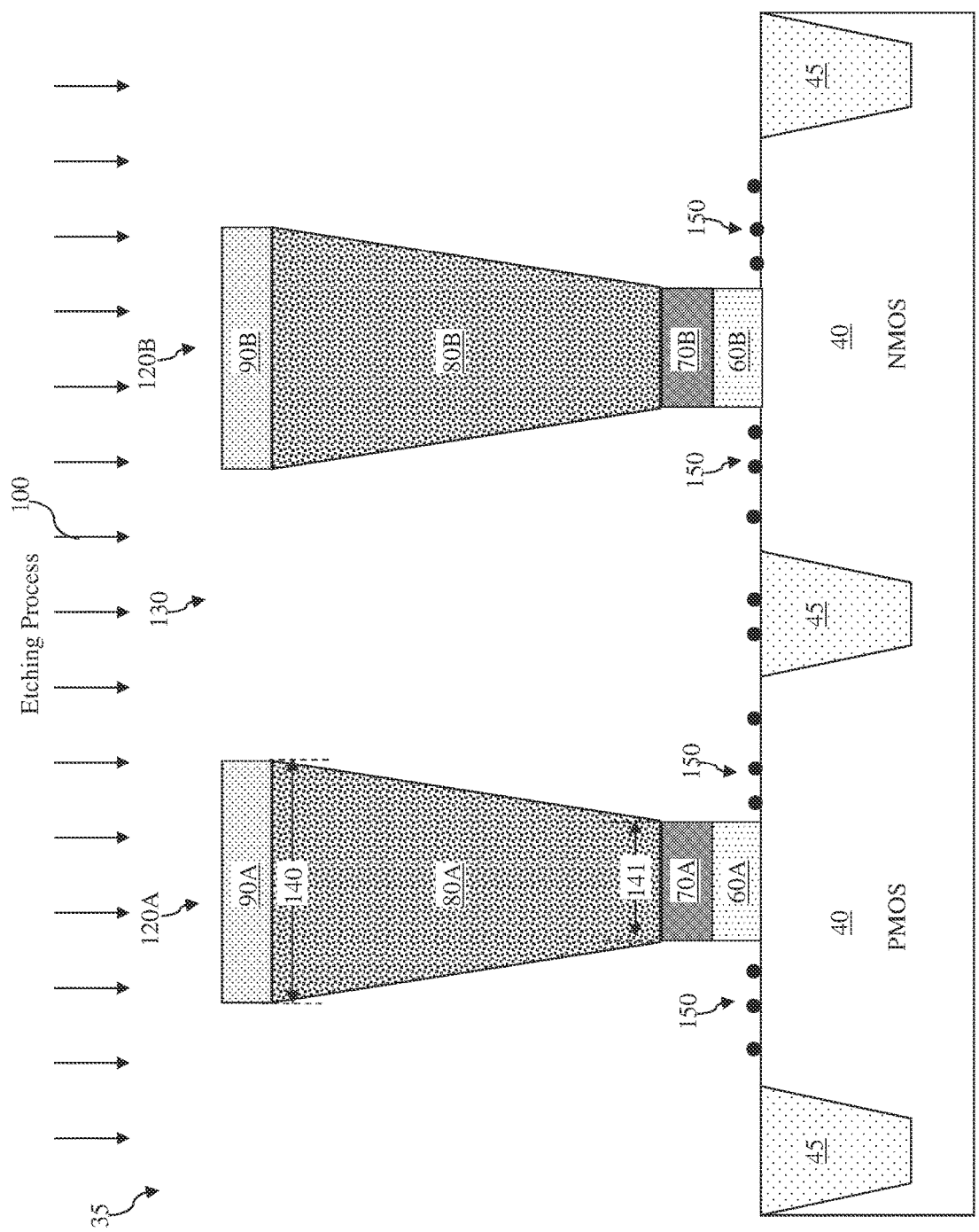
FIG. 2 is a diagrammatic cross-sectional side view of a semiconductor device at a stage of fabrication according to various embodiments of the present disclosure.

Referring now to FIG. 2, the segments 90A and 90B of the patterned hard mask layer 90 may be used as masks to define gate structures of transistors. In more detail, an etching process 100 is performed to etch the polysilicon layer 80. The segments 90A and 90B of the patterned hard mask layer 90 serve as etching masks in the etching process 100 to protect portions of the layers below (including the polysilicon layer 80, the capping layer 70, and the gate dielectric layer 60) from being etched.

The etching process 100 forms gate structures 120A and 120B separated by an opening 130, where the gate structure 120A includes the segment 90A, a remaining portion 80A of the polysilicon layer, a remaining portion 70A of the capping layer, and a remaining portion of the gate dielectric layer 60A, and the gate structure 120B includes the segment 90B, a remaining portion 80B of the polysilicon layer, a remaining portion 70B of the capping layer, and a remaining portion of the gate dielectric layer 60B. It is understood that the remaining portions 80A and 80B of the polysilicon layer serve as dummy gate electrodes herein and will be removed in a dummy gate replacement process later.

According to embodiments of the present disclosure, the etching process 100 is configured to form dummy gate electrodes 80A-80B whose sidewall profiles are sloped inwards. For example, the dummy gate electrode 80A (or 80B) has a lateral dimension 140 near its upper surface and a lateral dimension 141 nears its bottom surface. The lateral dimension 140 is greater than or equal to (or no less than) the lateral dimension 141. In some embodiments, the lateral dimension 140 is greater than the lateral dimension 141 by at least 5%, for example by about 5%-20%. Consequently, the dummy gate electrodes 80A and 80B shown in FIG. 2 each have a cross-sectional profile/shape that loosely resembles an inverse or upside-down trapezoid, though it is understood that in real world fabrication, the sidewall surfaces of the dummy gate electrodes 80A-80B may not be as straight or smooth as they are shown in FIG. 2, since FIG. 2 provides merely a simplified illustration.

This upside-down trapezoidal shape of the dummy gate electrodes 80A-80B is obtained by configuring the lateral etching characteristics of the etching process 100. For example, the etching process 100 may be configured to have increasingly stronger lateral etching characteristics as the etching progresses deeper (i.e., closer to the substrate 40). In some embodiments, the etching process 100 includes a plurality of etching steps, where each etching step has an associated lateral etching rate, and that each subsequent etching step has a greater lateral etching rate than a previous etching step.

The etching process (or the various etching steps included therein) may include simultaneously applying a high electronegativity etchant and a chlorine etchant inside an etching chamber, with the wafer undergoing the etching process 100 placed therein. In some embodiments, the chlorine etchant may include a $Cl_2$ gas or plasma with a flow rate in a range between about 30 standard cubic centimeters per minute (sccm) and about 36 sccm, and the high electronegativity etchant may include a fluorine-containing gas or plasma with a flow rate in a range between about 80 sccm to about 120 sccm. As non-limiting examples, the fluorine-containing gas or plasma may include a fluorine-rich material such as $C_xF_y$, (where x and y are positive integers, for example $CF_4$ or $C_2F_6$), $CHF_3$, $HBr$, or $NF_3$. The etching mechanism is as follows:

The fluorine-containing etchant reacts with a surface oxide (e.g., formed on the sidewalls of the dummy gate electrodes 80A-80B as they are being etched) to produce silicon-containing and oxygen-containing gases that can be removed from the etching chamber by a purging mechanism. For example, with $CF_4$ as an etchant, the surface oxide may react with $CF_4$ according to the following chemical formula: $SiO_2 + CF_4 => SiF_4 + CO_2$, where $SiF_4 + CO_2$ are gases that can be removed from the etching chamber.

The chlorine-containing etchant reacts with the polysilicon material of the dummy gate electrodes 80A-80B to form another gas (e.g., $SiCl_x$, where x is a positive integer) that can be removed from the etching chamber by a purging mechanism.

The flow rate of the fluorine-containing etchant may be correlated with the lateral etching characteristics of the etching process 100. For example, increasing the flow rate of the fluorine-containing etchant enhances the lateral etching rate of the etching process 100. As such, to achieve the desired top-wide bottom-narrow profile of the dummy gate electrodes 80A-80B, the etching process 100 may be configured such that the fluorine content is increased (e.g., by increasing the flow rate of the fluorine-containing etchant) as deeper and deeper portions of the polysilicon layer 80 are etched. For example, in a first etching step performed to etch a top portion of the dummy gate electrode 80A/80B, the flow rate of the fluorine-containing etchant may be configured to be X sccm. In a second etching step performed to etch a middle portion of the dummy gate electrode 80A/80B, the flow rate of the fluorine-containing etchant may be configured to be Y sccm. In a third etching step performed to etch a bottom portion of the dummy gate electrode 80A/80B, the flow rate of the fluorine-containing etchant may be configured to be Z sccm. Z is greater than Y, and Y is greater than X, and X is no less than 80 sccm. Of course, the three etching steps are merely examples, and the etching process 100 may be configured to have two etching steps or four or more etching steps in other embodiments, as long as the fluorine content in the etchant increases with each etching step.

Due to the rich fluorine content of the etchant used herein, fluorine particles 150 may remain on the surfaces of the substrate 40, the STI features 45, or even on the side surfaces of the gate structures 120A-120B after the etching process 100 has been completed. Due to the high fluorine content in the etching process 100, these fluorine particles may still remain after various cleaning processes are performed. In other words, the removal of the fluorine particles 150 may not be complete, and some traces of them may be found in an actually fabricated semiconductor device. The presence of the fluorine particles 150 may be detected by certain semiconductor fabrication inspection tools. The remnants of fluorine may be evidence that an etching process similar to the etching process 100 according to the present disclosure is used to fabricate the semiconductor device.

Figure 2A:
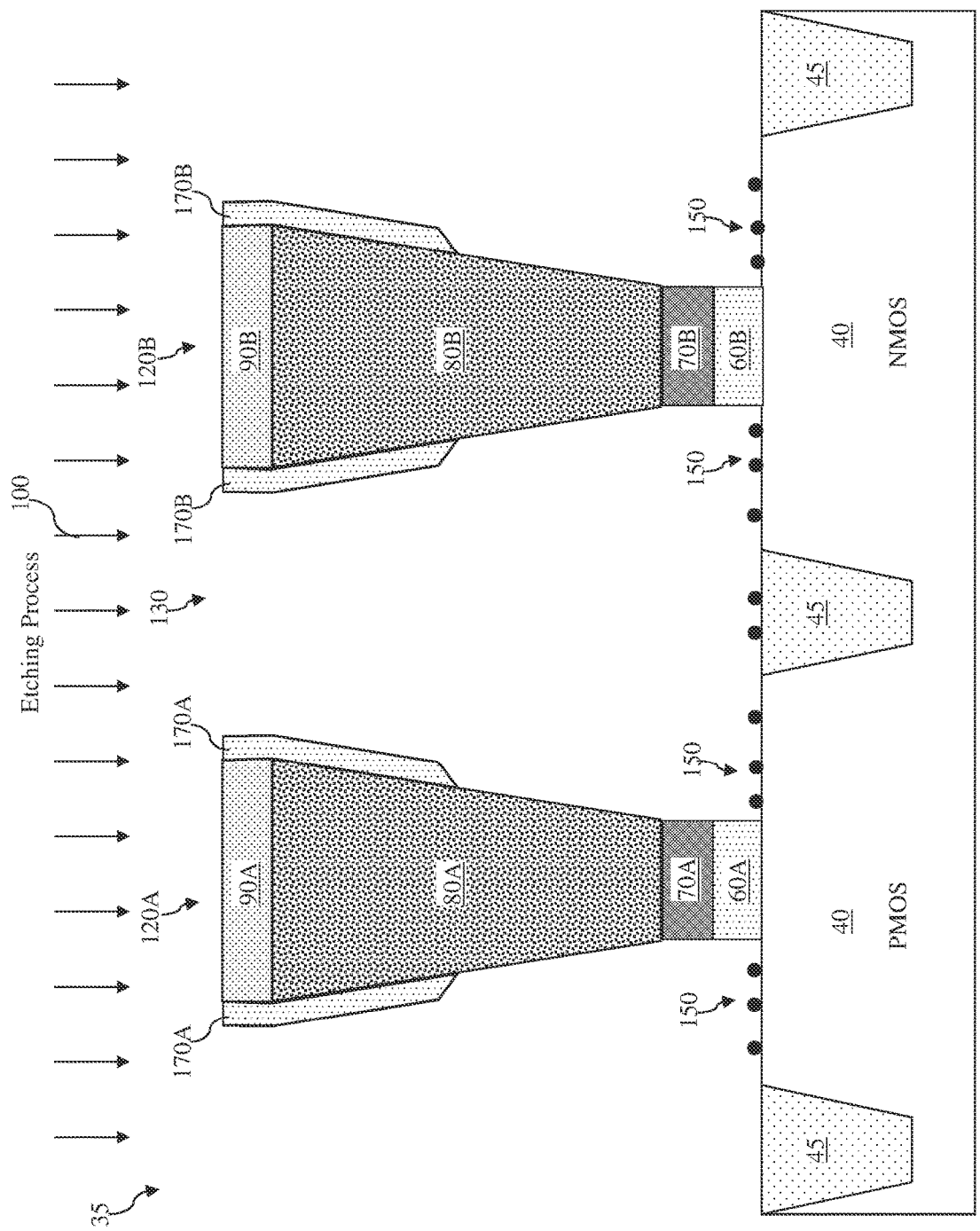
FIG. 2A is a diagrammatic cross-sectional side view of a semiconductor device at a stage of fabrication according to various embodiments of the present disclosure.

In some embodiments, a passivation gas may also be applied along with the etchant to facilitate the formation of the dummy gate electrodes 80A-80B with the top-wide bottom-narrow profiles. The passivation gas forms a passivation material on the exposed surfaces of the polysilicon layer 80 as the etching process 100 takes place. The passivation material helps prevent further etching of the polysilicon material. A simplified example of this is shown in FIG. 2A. Referring to FIG. 2A, as a top portion of the polysilicon layer 80 is etched, the passivation gas forms the passivation materials 170A-170B on the sidewalls of the dummy gate electrodes 80A-80B near the top. This will allow the etching process 100 to progress downwards and continue the lateral etching of the lower portions of the polysilicon layer 80 without further lateral etching of the dummy gate electrodes 80A-80B at the top, because they are protected by the passivation materials 170A-170B.

It is also noted that since the dummy gate electrodes 80A-80B have top-wide bottom-narrow profiles, the opening 130 separating the dummy gate electrodes 80A-80B has a top-narrow and bottom-wide profile.

Figure 3:
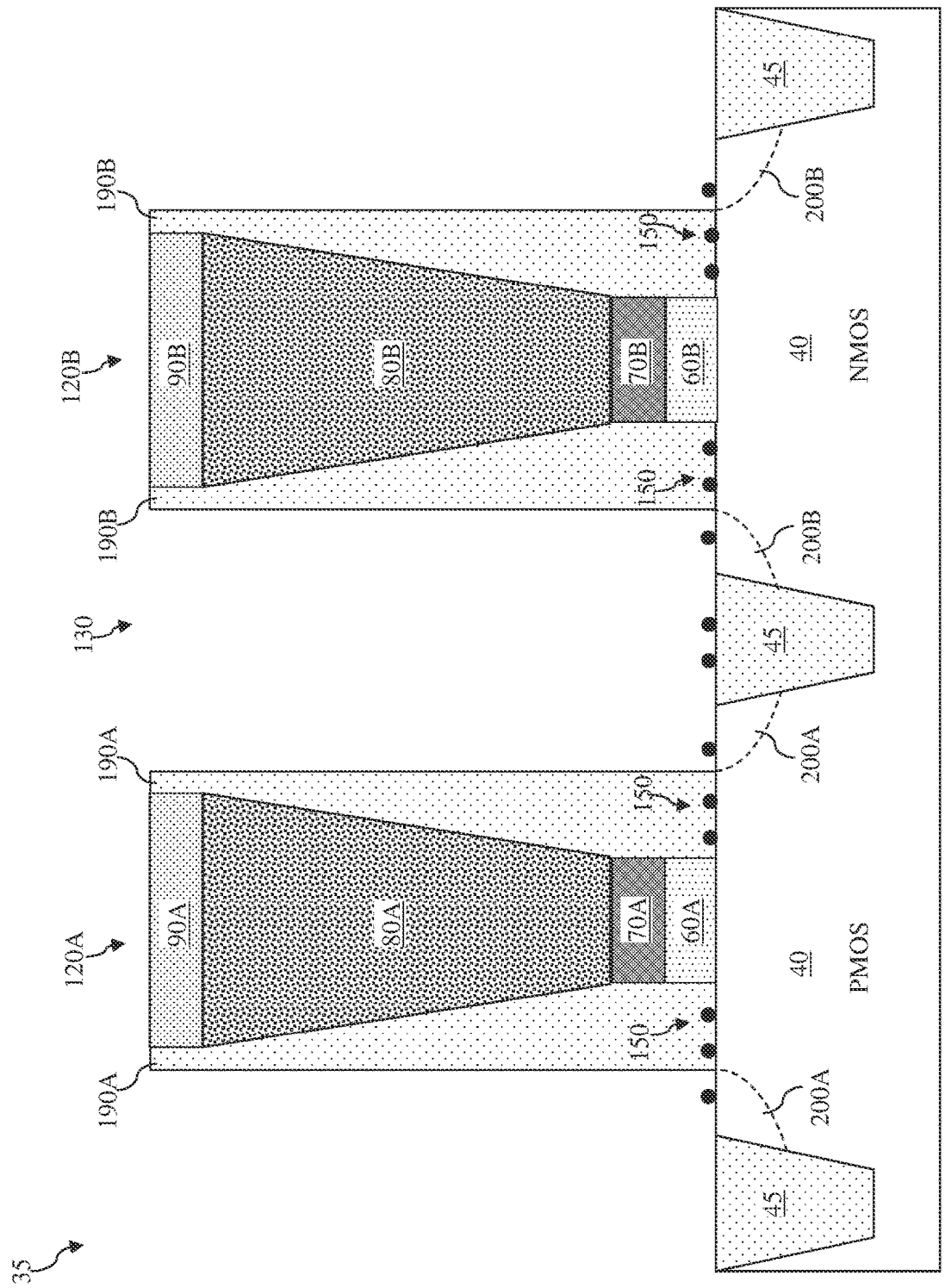
FIG. 3 is a diagrammatic cross-sectional side view of a semiconductor device at a stage of fabrication according to various embodiments of the present disclosure.

Referring now to FIG. 3, gate spacers 190A-190B are formed on sidewalls of the gate structures 120A-120B. The gate spacers 190A-190A include a dielectric material. In some embodiments, the gate spacers 190A-190B include silicon nitride. In alternative embodiments, the gate spacers 190A-190B may include silicon oxide, silicon carbide, silicon oxy-nitride, or combinations thereof.

Thereafter, heavily doped source and drain regions 200A and 200B (also referred to as S/D regions) are formed in the NMOS and PMOS portions of the substrate 40, respectively. The S/D regions 200A-200B may be formed by an ion implantation process, or by a diffusion process. N-type dopants such as phosphorus or arsenic may be used to form the NMOS S/D regions 200B, and P-type dopants such as boron may be used to form the PMOS S/D regions 200A. As is illustrated in FIG. 3, the S/D regions 200A-200B are aligned with the outer boundaries of the gate spacers 190A-190B, respectively. Since no photolithography process is required to define the area or the boundaries of the S/D regions 200A-200B, it may be said that the S/D regions 200A-200B are formed in a "self-aligning" manner. One or more annealing processes are performed on the semiconductor device 35 to activate the S/D regions 200A-200B. It is also understood that in some embodiments, lightly-doped source/drain (LDD) regions may be formed in both the NMOS and PMOS regions of the substrate 40 before the gate spacers 190A-190B are formed. For reasons of simplicity, the LDD regions are not specifically illustrated herein.

Figure 4:
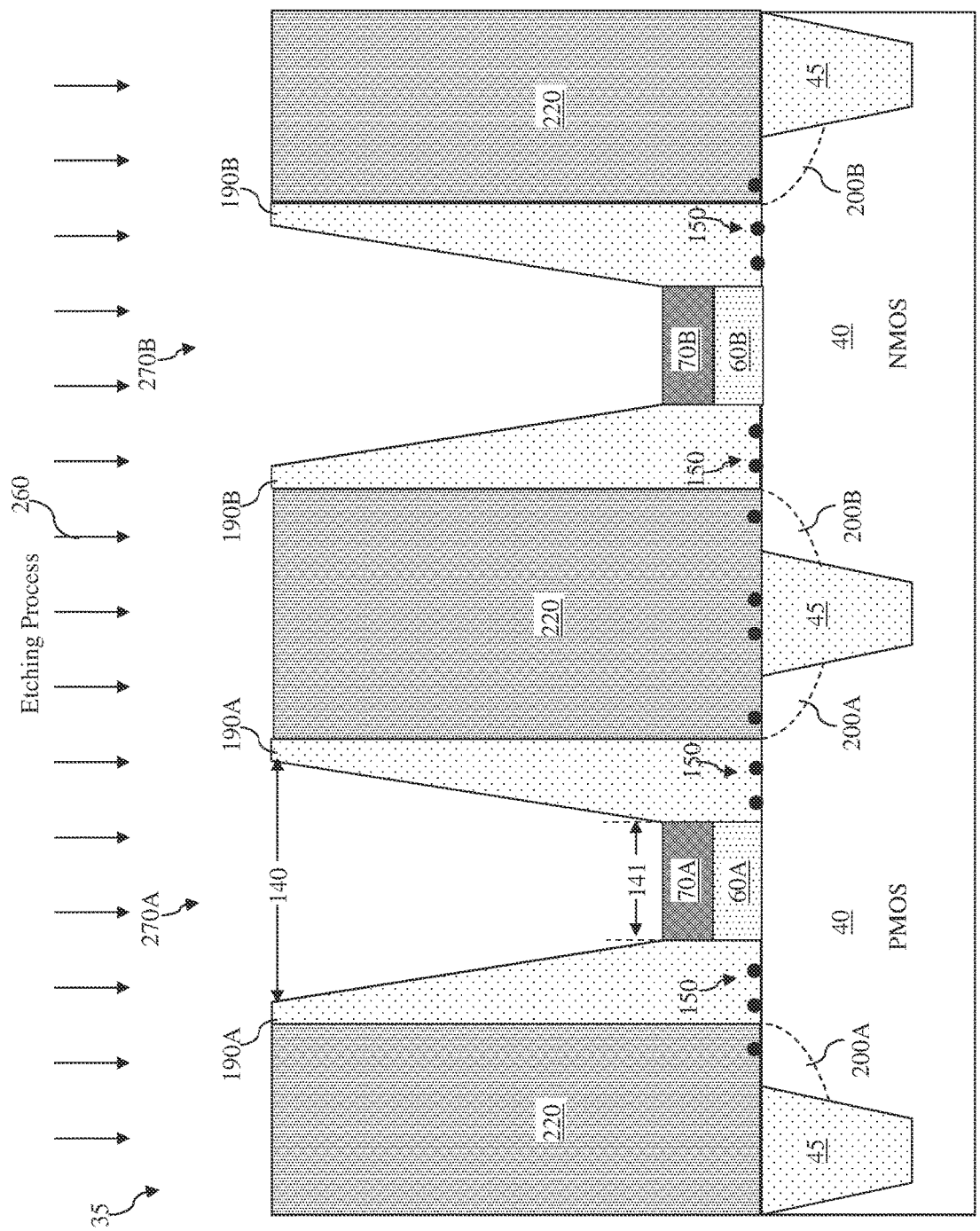
FIG. 4 is a diagrammatic cross-sectional side view of a semiconductor device at a stage of fabrication according to various embodiments of the present disclosure.

Referring now to FIG. 4, an inter-layer (or inter-level) dielectric (ILD) layer 220 is formed over the substrate 40 and the gate structure 220. The ILD layer 220 may be formed by chemical vapor deposition (CVD), high density plasma CVD, spin-on, sputtering, or other suitable methods. The ILD layer 220 fills the opening 130, for example. In an embodiment, the ILD layer 220 includes silicon oxide. In other embodiments, the ILD layer 220 may include silicon oxy-nitride, silicon nitride, or a low-k material. A polishing process (for example a chemical-mechanical-polishing (CMP) process) may be performed on the ILD layer 220 to planarize the ILD layer 220. The polishing is performed until top surfaces of the dummy gate electrodes 80A of gate structures 120A-120B are exposed. The hard masks 90A-90B are also removed by the polishing process.

Still referring to FIG. 4, after the formation of the ILD layer 200 and the subsequent planarization thereof, an etching process 260 is performed to remove the dummy gate electrodes 80A-80B. In some embodiments, the etching process 260 may include a dry etching process. The gate dielectric layer 60A-60B and the capping layer 70A-70B are not removed by the etching process 260 in the illustrated embodiment. As a result of the etching process 260, trenches or openings 270A-270B are formed. Since the dummy gate electrodes 80A-80B are formed to have a profile such that it is wider at the top and narrower at the bottom (e.g., dimension 140>=dimension 141), the trenches 270A-270B also inherit this profile, meaning that the trenches may also have a wider lateral dimension 140 at its top and a narrower dimension 141 at its bottom. This specifically-configured shape/profile of the trenches 270A-270B makes them easier to fill, even if the trenches 270A-270 have small CDs and high aspect ratios.

Figure 5:
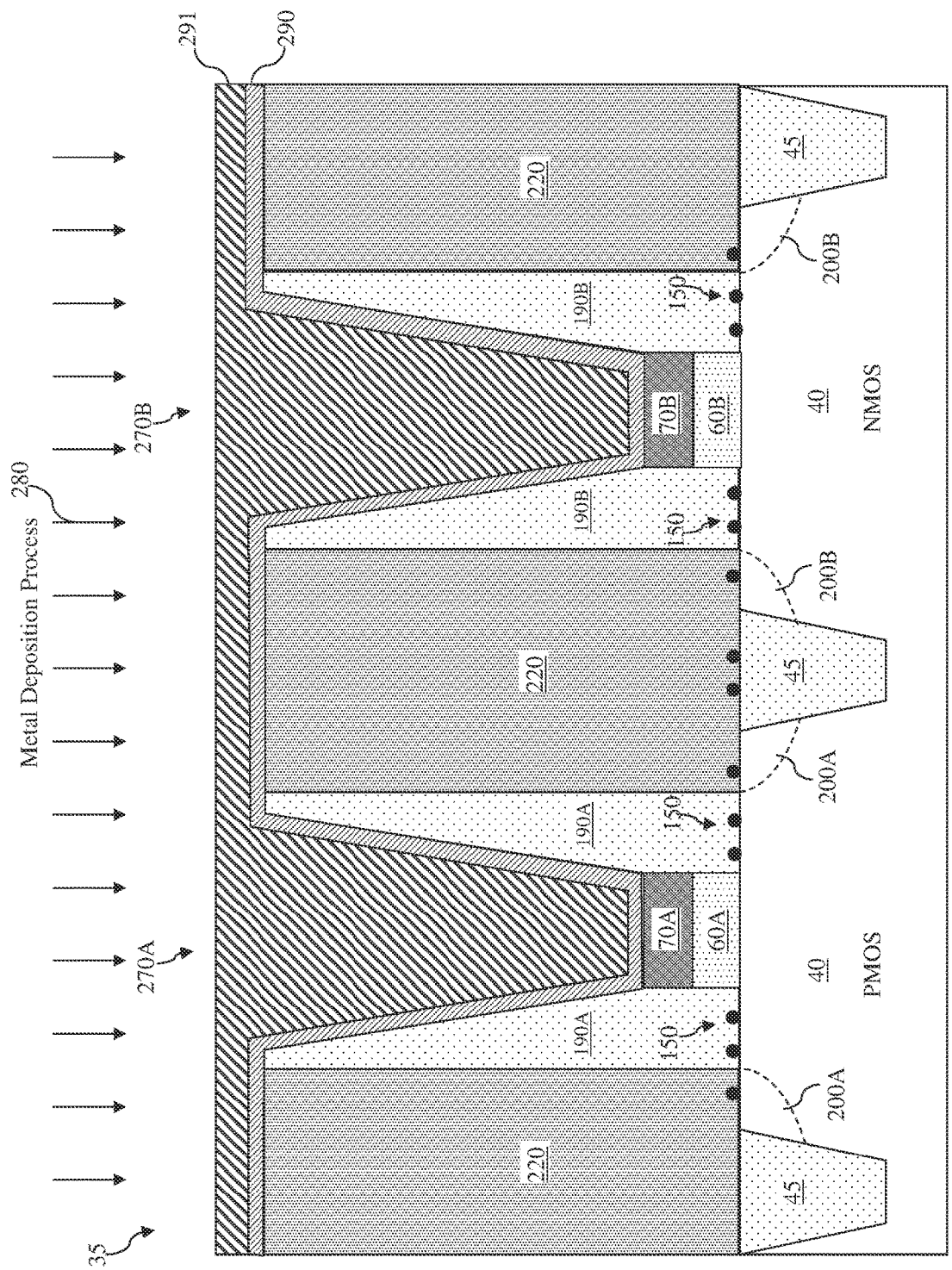
FIG. 5 is a diagrammatic cross-sectional side view of a semiconductor device at a stage of fabrication according to various embodiments of the present disclosure.

Referring now to FIG. 5, a plurality of metal deposition processes 280 are performed to deposit a metal layer 290 and a metal layer 291. The metal layer 290 is formed over the exposed surfaces of the ILD layer 220, the spacers 190A-190B, the capping layer 70A-70B, and partially fill the trenches 270A-270B. The metal layer 291 is formed over the metal layer 290. In some embodiments, the metal layer 290 includes a work function metal, which helps tune a work function of a MOS transistor, such that a desired threshold voltage may be achieved for the MOS transistor. In some embodiments, the work function metal may include a P-type work function metal, which may contain tungsten (W), tungsten nitride (WN), or tungsten aluminum (WAl) as examples. In some embodiments, the work function metal may include an N-type work function metal, which may contain titanium nitride (TiN) as an example.

In some embodiments, the metal layer 291 includes a fill metal, which serves as the main conductive portion of the gate electrode. In some embodiments, the fill metal layers contain tungsten (W), aluminum (Al), titanium (Ti), Copper (Cu), or combinations thereof. In other embodiments, a blocking layer may be formed between the fill metal layer and the work function metal, so as to reduce diffusion between the work function metal and the fill metal. The blocking layer may include TiN or TaN. Furthermore, a wetting layer (e.g., containing Ti) may be optionally formed between the blocking layer and the fill metal layer to enhance the formation of the fill metal layer.

Figure 6:
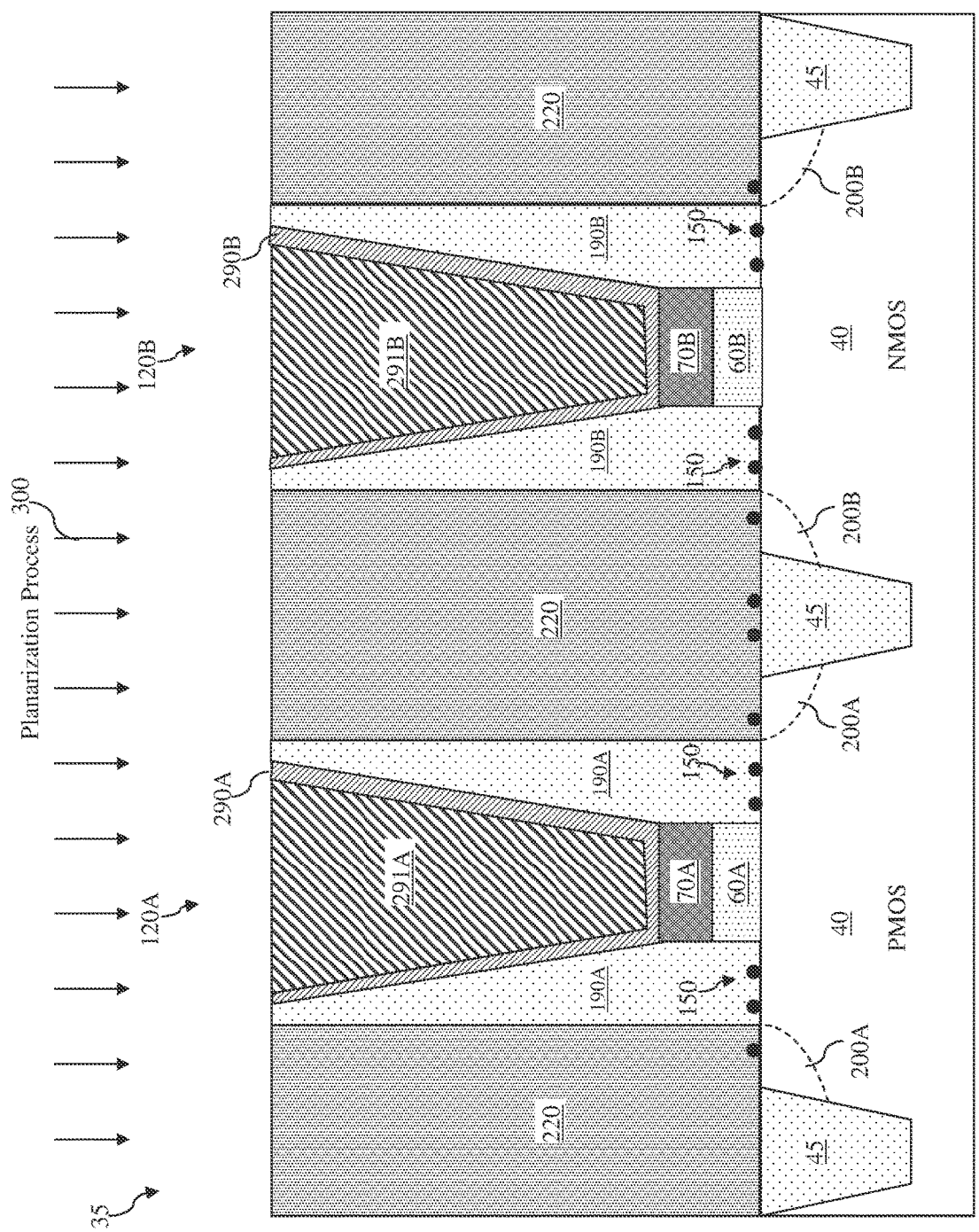
FIG. 6 is a diagrammatic cross-sectional side view of a semiconductor device at a stage of fabrication according to various embodiments of the present disclosure.

Referring now to FIG. 6, a planarization process 300 is performed to polish the metal layers 291 and 290 until the upper surfaces of the metal layers 291 and 290 are substantially coplanar with the upper surface of the ILD layer 220. In some embodiments, the planarization process 300 includes a CMP process. After the planarization process 300 is performed, the remaining portions 290A and 291A of the metal layers filling the trench 270A collectively constitute a metal gate electrode for the PMOS, and the remaining portions 290B and 291B of the metal layers filling the trench 270B collectively constitute a metal gate electrode for the NMOS.

For reasons discussed above, the profile of the trenches 270A-270B allow for the metal layers 290-291 to easily fill in the trenches 270A-270B without gaps or voids. In contrast, in conventional gate replacement processes, the metal gate formation may be impeded by overhangs that exist near the upper portions of the openings (i.e., openings formed by the removal of the dummy gate electrodes). Overhangs are formed as a result of conventional fabrication, because of the tapered shape of the etched dummy gate electrodes where the top is narrower than the bottom. Thus, the resulting trench would also be narrower at the top and wider at the bottom, thereby creating the overhangs. The overhangs may cause difficulties in the metal layers filling the trenches, thus leading to voids/gaps within the metal electrodes. This problem is overcome by the present disclosure, because the etching process 100 discussed above with reference to FIG. 2 is specifically configured (e.g., by increasing the lateral etching rate as the etching gets deeper) to form dummy gate electrodes 80A-80B that are wider at the top and narrower at the bottom, thereby allowing for easy filling of the trenches 270A-270B without substantial voids or gaps in the formed metal electrodes. Thus, semiconductor performance is improved.

Figure 7:
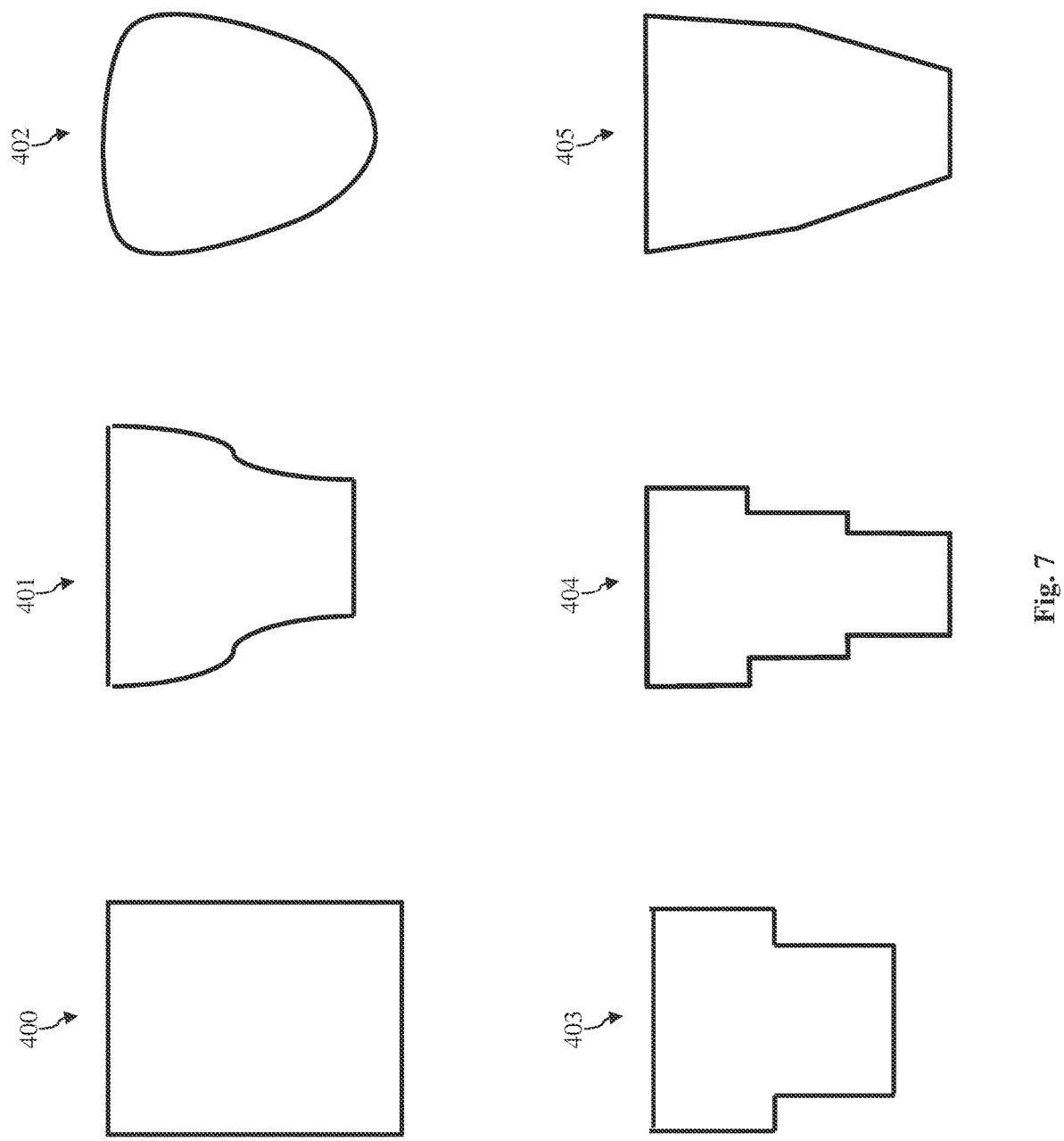
FIG. 7 illustrates several suitable cross-sectional profiles for the dummy gate electrodes fabricated according to various embodiments of the present disclosure.

It is understood that although FIGS. 2-6 illustrate an approximately inverse trapezoidal profile (i.e., loosely resembling an upside-down trapezoid) for the etched dummy gate electrodes 80A-80B (and therefore the same profile for the metal gate electrodes that replace the dummy gate electrodes), this particular profile/shape is not required but can be changed in different embodiments. For example, FIG. 7 illustrates several other suitable cross-sectional profiles/shapes 400-405 for the dummy gate electrodes 80A-80B (and thus the metal gate electrodes). The profile 400 is shaped similar to a rectangle where a lateral dimension and its top and a lateral dimension at its bottom are similar to one another. The profile 401 is shaped to have side surfaces that each include a concave segment and a convex segment. The profile 402 is shaped to have more curved or rounded sidewall surfaces. The profile 403 is shaped similar to two combined rectangles where an upper rectangle is wider than a bottom rectangle. The profile 404 is shaped similar to three combined rectangles where an upper rectangle is wider than a middle rectangle, which is wider than a bottom rectangle. The profile 405 is similar to two combined upside-down trapezoids, where a top trapezoid is wider than a bottom trapezoid.

For all the profiles 400-405, they have the common factor that the lateral dimension at the top is greater than or equal to the lateral dimension at the bottom. Again, this is configured to allow for easy filling to form void-free metal gate electrodes. These profiles or shapes 400-405 shown in FIG. 7 can be achieved by tuning the process recipes or process parameters of the etching process 100 discussed above. Indeed, other suitable profiles/shapes (not illustrated herein) may also be obtained for the dummy gate electrodes (and thus the metal gate electrodes) according to the various aspects of the present disclosure.

The gate replacement process discussed above pertain to a "gate-last" process, where the high-k gate dielectric is formed, and the dummy gate electrode is formed and then replaced by a metal gate electrode. However, it is understood that the various aspects of the present disclosure may also apply to a "high-k last" gate replacement process as well. In a "high-k last" gate replacement process, instead of forming a high-k gate dielectric, a dummy gate dielectric (e.g., silicon oxide) is formed first, and a dummy gate electrode (e.g., polysilicon) is formed on the dummy gate dielectric. After the formation of the source/drain regions, the dummy gate dielectric is replaced by the high-k gate dielectric, and the dummy gate electrode is replaced by the metal gate electrode. Regardless, the etching processes discussed above still apply to form the dummy gate electrode and the dummy gate dielectric to have the profiles where the top is wider than the bottom, so as to facilitate the filling of the openings with the high-k dielectric and the metal gate electrode. Furthermore, it is understood that the aspects of the present disclosure may apply to both "2-dimensional" planar devices or "3-dimensional" FinFET devices.

It is also understood that additional processes may be performed to complete the fabrication of the semiconductor device 35. For example, these additional processes may include formation of contact holes for the gate structures, formation of interconnect structures (e.g., lines and vias, metal layers, and interlayer dielectric that provide electrical interconnection to the device including the formed metal gate), deposition of passivation layers, packaging, testing, etc. For the sake of simplicity, these additional processes are not described herein. It is also understood that some of the fabrication processes for the various embodiments discussed above may be combined depending on design needs and manufacturing requirements.

Figure 8:
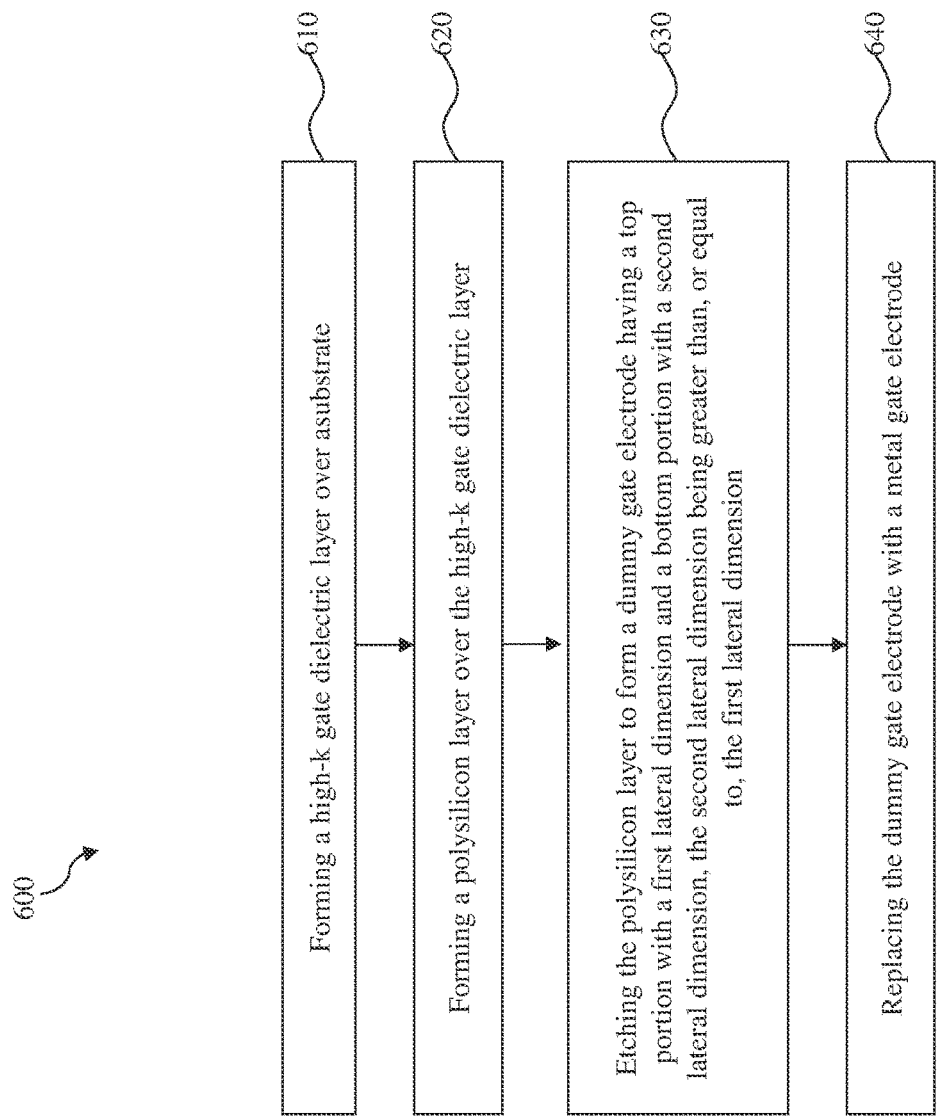
FIG. 8 is a flow chart of a method for fabricating a semiconductor device in accordance with embodiments of the present disclosure.

FIG. 8 is a flowchart of a method 600 for fabricating a semiconductor device in accordance with various aspects of the present disclosure. The method 600 includes a step 610 of forming a high-k gate dielectric layer over a substrate.

The method 600 includes a step 620 of forming a polysilicon layer over the high-k gate dielectric layer.

The method 600 includes a step 630 of etching the polysilicon layer to form a dummy gate electrode having a top portion with a first lateral dimension and a bottom portion with a second lateral dimension. The first lateral dimension is greater than, or equal to, the second lateral dimension.

The method 600 includes a step 640 of replacing the dummy gate electrode with a metal gate electrode.

In some embodiments, the top portion of the dummy gate electrode is formed when the etching is performed with a first lateral etching rate, and the bottom portion of the dummy gate electrode is formed when the etching is performed with a second lateral etching rate greater than the first lateral etching rate.

In some embodiments, the etching comprises using a fluorine-containing etchant, and wherein the etching is performed by increasing a fluorine content of the etchant as the etching progresses deeper into the polysilicon layer. In some embodiments, the increasing the fluorine content comprises increasing a flow rate of the fluorine-containing etchant. In some embodiments, the flow rate is no less than 80 standard cubic centimeters per minute (sccm) throughout the etching. In some embodiments, the flow rate is in a range between about 80 sccm and about 120 sccm. In some embodiments, the etching comprises applying a chorine-containing etchant simultaneously with the fluorine-containing etchant.

In some embodiments, the etching comprises applying a passivation gas when the top portion of the dummy gate electrode is etched.

In some embodiments, the etching is performed such that the dummy gate electrode has a cross-sectional profile that resembles an upside-down trapezoid.

In some embodiments, the first lateral dimension is greater than the second lateral dimension by at least 20%.

It is understood that additional process steps may be performed before, during, or after the steps 610-640 discussed above to complete the fabrication of the semiconductor device. For example, before the replacing of the dummy gate electrode, the method 600 may include a step of forming spacers on sidewalls of the dummy gate electrode, forming source/drain regions in the substrate on opposite sides of the dummy gate electrode, and forming an interlayer dielectric (ILD) over the substrate. Other process steps are not discussed herein for reasons of simplicity.

Based on the above discussions, it can be seen that the present disclosure offers advantages over conventional systems and methods of forming rail structures. It is understood, however, that other embodiments may offer additional advantages, and not all advantages are necessarily disclosed herein, and that no particular advantage is required for all embodiments. One advantage is the reduction or elimination of the overhang problem plaguing existing gate replacement processes. By configuring the etching process carefully, the resulting dummy gate electrode can be formed to have a profile such that it is wider at the top and narrow at the bottom. Once the dummy gate electrode is removed, the trench formed in place of the removed dummy gate electrode also inherits this top-wide and bottom-narrow profile. This profile makes the trench easy to fill with a metal material, which is used to form the metal gate electrode. Consequently, the formed metal gate electrode is substantially void-free or gap-free, thereby having improved performance than conventionally formed metal gates.

One aspect of the present disclosure involves a method of fabricating a semiconductor device. A polysilicon layer is formed over a substrate. The polysilicon layer is etched to form a dummy gate electrode having a top portion with a first lateral dimension and a bottom portion with a second lateral dimension. The first lateral dimension is greater than, or equal to, the second lateral dimension. The dummy gate electrode is replaced with a metal gate electrode.

Another aspect of the present disclosure involves a method of fabricating a semiconductor device. A gate dielectric layer is formed over a substrate. A dummy gate electrode layer is formed over the gate dielectric layer. The dummy gate electrode layer is etched with an etchant that contains fluorine and chlorine to form a dummy gate electrode. The etching comprising increasing a fluorine content of the etchant as the etching progresses deeper into the dummy gate electrode layer. Spacers are formed on sidewalls of the dummy gate electrode. Source/drain regions are formed in the substrate on opposite sides of the dummy gate electrode. The dummy gate electrode is replaced with a metal gate electrode.

Yet another aspect of the present disclosure involves a semiconductor device. The semiconductor device includes a high-k gate dielectric layer disposed over a substrate. The semiconductor device includes a metal gate electrode disposed over the high-k gate dielectric layer. The metal gate electrode has a top portion and a bottom portion. The bottom portion is located closer to the high-k gate dielectric layer than the top portion. The top portion has a first lateral dimension. The bottom portion has a second lateral dimension. The first lateral dimension is no less than the second lateral dimension.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a dummy gate electrode layer over a gate dielectric layer;
    forming a patterned mask layer over the dummy gate electrode layer;
    patterning, using the patterned mask layer as a mask, the dummy gate electrode layer and the gate dielectric layer into a plurality of dummy gate stacks that are spaced apart from one another, wherein each of the dummy gate stacks includes a patterned gate dielectric and a patterned dummy gate electrode, wherein the patterning is performed such that each of the patterned dummy gate electrodes has a top-wide-bottom-narrow profile in a cross-sectional side view, and wherein each of the patterned gate dielectrics has a rectangular profile in the cross-sectional side view, wherein the patterning includes etching, using a fluorine-containing etchant, the dummy gate electrode layer with increasingly stronger lateral etching characteristics, wherein the etching the dummy gate electrode layer includes performing three or more etching steps, wherein each subsequent etching step etches the dummy gate electrode layer at a greater etchant flow rate than a previous etching step, such that a last etching step of the etching is performed with a strongest lateral etching characteristic;
    forming gate spacers on sidewalls of the patterned dummy gate electrodes; and
    replacing the patterned dummy gate electrodes with metal-containing gate electrodes.

2. The method of claim 1, wherein the etching the dummy gate electrode layer includes etching the dummy gate electrode layer inside an etching chamber while an electronegativity etchant is applied, and wherein the electronegativity etchant contains the fluorine-containing etchant.

3. The method of claim 1, wherein the fluorine-containing etchant includes $CHF_3$ or $NF_3$.

4. The method of claim 1, wherein the fluorine-containing etchant comprises a fluorine-containing gas or plasma that is applied with a flow rate in a range between about 80 standard cubic centimeters per minute (sccm) and about 120 sccm.

5. The method of claim 4, wherein the etching the dummy gate electrode layer with increasingly stronger lateral etching characteristics includes increasing a flow rate of the fluorine-containing gas or plasma as deeper portions of the dummy gate electrode layer are reached, such that a deepest portion of the dummy gate electrode layer is etched with a greatest flow rate of the fluorine-containing gas or plasma.

6. The method of claim 1, wherein the etching the dummy gate electrode layer includes etching the dummy gate electrode layer inside an etching chamber while a chlorine etchant is applied.

7. The method of claim 6, wherein the chlorine etchant is applied with a flow rate in a range between about 30 standard cubic centimeters per minute (sccm) and about 36 sccm.

8. The method of claim 1, wherein the patterning further includes applying a passivation gas during the patterning.

9. The method of claim 8, wherein the applying the passivation gas is performed such that a passivation layer is formed on an upper portion, but not an entirety, of a side surface of each of the patterned dummy gate electrodes during the etching.

10. The method of claim 1, wherein the forming the dummy gate electrode layer includes forming a polysilicon gate electrode layer over a high-k gate dielectric layer, and wherein the method further comprises:
    forming a capping layer over the gate dielectric layer, wherein the dummy gate electrode layer is formed over the capping layer, and wherein the capping layer contains a rare earth material; and
    forming an interlayer dielectric (ILD) after the forming of the gate spacers, wherein portions of the ILD are formed between the gate spacers.

11. The method of claim 1, wherein the gate dielectric layer is formed over a substrate, and wherein the patterning leaves fluorine-containing particles on a surface of the substrate.

12. A method, comprising:
    forming a gate dielectric layer over a substrate;
    forming a dummy gate electrode layer over the gate dielectric layer;
    patterning, via more than two etching processes that use at least an electronegativity etchant that contains fluorine, the dummy gate electrode layer into a plurality of patterned dummy gate electrodes, wherein the more than two etching processes are performed with increasingly stronger lateral etching characteristics, including setting a highest flow rate of the electronegativity etchant for a last etching process of the more than two etching processes, such that the patterned dummy gate electrodes each have a tapered cross-sectional profile where an upper portion of the patterned dummy gate electrode is wider than a lower portion of the patterned dummy gate electrode;
    forming gate spacers on sidewalls of the patterned dummy gate electrodes;

removing the patterned dummy gate electrodes, thereby forming a plurality of openings defined at least in part via the gate spacers; and filling the plurality of openings with a metal-containing gate electrode layer.

13. The method of claim 12, wherein the more than two etching processes are performed inside an etching chamber while the electronegativity etchant and a chlorine etchant are simultaneously applied.

14. The method of claim 13, wherein:
the electronegativity etchant includes $CHF_3$ or $NF_3$.

15. The method of claim 13, wherein:
the electronegativity etchant is applied with a flow rate in a range between about 80 standard cubic centimeters per minute (sccm) and about 120 sccm; and
the chlorine etchant is applied with a flow rate in a range between about 30 sccm and about 36 sccm.

16. The method of claim 12, wherein the patterning further includes forming a passivation layer partially on side surfaces of the dummy gate electrode layer during the etching.

17. A method, comprising:
forming a dummy gate structure over a substrate, wherein the dummy gate structure includes a gate dielectric and a gate electrode;
performing a first etching process on the dummy gate structure, wherein the first etching process is performed at least in part using a fluorine-containing etchant and has a first lateral etching characteristic;
after the first etching process, performing a second etching process on the dummy gate structure, wherein the second etching process is performed at least in part using the fluorine-containing etchant and has a second lateral etching characteristic that is greater than the first lateral etching characteristic;
after the second etching process, performing a third etching process on the dummy gate structure, wherein the third etching process is performed at least in part using the fluorine-containing etchant and has a third lateral etching characteristic that is greater than the second lateral etching characteristic, wherein the dummy gate structure is etched into a plurality of patterned dummy gate structures that are separated from one another after the third etching process has been performed, wherein the gate electrode in each of the patterned dummy gate structures has sloped sidewalls, and wherein the gate dielectric in each of the patterned dummy gate structures has substantially straight sidewalls;
forming gate spacers on sidewalls of the patterned dummy gate structures; and
replacing the patterned dummy gate structures with metal-containing gate structures.

18. The method of claim 17, wherein:
the first etching process is performed at a first etchant flow rate;
the second etching process is performed at a second etchant flow rate greater than the first etchant flow rate;
the third etching process is performed at a third etchant flow rate greater than the second etchant flow rate; and
no more etching process is performed on the dummy gate structure after the third etching process.

19. The method of claim 17, wherein the first etching process, the second etching process, and the third etching process are further performed using a chlorine-containing etchant in addition to the fluorine-containing etchant.

20. The method of claim 17, wherein the fluorine-containing etchant includes $CHF_3$ or $NF_3$.

* * * * *